United States Patent [19]

Minagawa et al.

[11] Patent Number: 4,473,767

[45] Date of Patent: Sep. 25, 1984

[54] SURFACE ACOUSTIC WAVE CONVOLVER WITH DEPLETION LAYER CONTROL

[75] Inventors: Shoichi Minagawa; Takamasa Sakai; Takeshi Okamoto, all of Tokyo, Japan

[73] Assignee: Clarion Co., Ltd., Tokyo, Japan

[21] Appl. No.: 438,437

[22] Filed: Nov. 2, 1982

[30] Foreign Application Priority Data

Nov. 6, 1981 [JP] Japan .............................. 56-178115

[51] Int. Cl.[3] .............................................. H03H 11/26

[52] U.S. Cl. ............................ 310/313 D; 310/313 B; 333/154; 333/196; 364/821

[58] Field of Search ....................... 310/313 B, 313 D; 330/4.9; 331/107 A; 333/150, 153, 152, 154, 155, 196; 364/821, 861

[56] References Cited

U.S. PATENT DOCUMENTS

| | | | |
|---|---|---|---|
| 3,484,865 | 12/1969 | Nienhuis | 357/14 |
| 4,037,174 | 7/1977 | Moore et al. | 333/152 |
| 4,099,146 | 7/1978 | DeVries | 364/821 |
| 4,194,171 | 3/1980 | Jelks | 333/149 |
| 4,398,114 | 8/1983 | Minagawa et al. | 310/313 R |

*Primary Examiner*—J. D. Miller
*Assistant Examiner*—D. L. Rebsch
*Attorney, Agent, or Firm*—Flynn, Thiel, Boutell & Tanis

[57] ABSTRACT

A surface acoustic wave convolver comprises a piezoelectric substrate on which a plurality of conductive strip electrodes, an input signal transducer and a reference signal transducer are formed, and a semiconductive substrate on which depletion layer control electrodes and capacitance read-out electrodes are formed. The conductive strip electrodes are connected to the depletion layer control electrodes so that an output signal is taken up from the capacitance read-out electrodes.

3 Claims, 5 Drawing Figures

SURFACE ACOUSTIC WAVE CONVOLVER WITH DEPLETION LAYER CONTROL

FIELD OF THE INVENTION

This invention relates to a surface acoustic wave convolver, and is particularly directed to improvement of the convolution efficiency.

BACKGROUND OF THE INVENTION

A surface acoustic wave convolver has been known as being a device utilizing nonlinearity of a surface acoustic wave medium wherein highly concentrated elastic energy can exist in a portion of the surface of the medium without spreading throughout the surface when a surface elastic wave travels along the surface. FIG. 1 is a theoretical diagram of a surface acoustic wave convolver wherein the reference numeral 1 designates a piezoelectric substrate, 2 and 3 denote a pair of input terminals provided at both sides of the substrate 1, and 4 denotes an output terminal disposed between the input terminals 2 and 3. Pulse signals applied to the input terminals 2 and 3, respectively, travel as surface acoustic waves along the surface of the piezoelectric substrate 1 toward the center and are taken up from the output terminal 4 as being convolution signals owing to nonlinearity of the substrate 1. In manufacturing such a surface acoustic wave convolver, it is preferable to enforce linearity of the piezoelectric substrate 1.

FIG. 2 shows a conventional convolver wherein the output terminal zone is constructed as being a nonlinear capacitance zone in order to emphasize the nonlinearity. In this Figure, the reference numeral 1 refers to a piezoelectric substrate, 5 to an input signal transducer including input signal terminals 5A and 5B, 6 to a reference signal transducer including reference signal terminals 6A and 6B, and 7 to a nonlinear capacitance zone, respectively. The nonlinear capacitance zone 7 includes a bias voltage terminal 8, convolution signal output terminals 9A and 9B, and plural pairs of bias resistors 10 and variable-capacitance diodes 11 which are connected in series between the bias voltage terminal 8 and the convolution signal output terminal 9A. This arrangement is advantageous in improvement of nonlinearity because it permits the nonlinear capacitance zone 7 to be designed independently from the travelling path of surface waves.

With the aforedescribed arrangement, however, improvement of convolution efficiency could not be effected easily because the variable-capacitance diodes 11 are two-terminal elements, so that it is difficult to control capacitance variation of the variable-capacitance diodes 11 themselves with respect to bias voltage as desired.

OBJECT OF THE INVENTION

The present invention has been made to overcome the aforementioned drawback in the prior art, and provides a surface acoustic wave convolver in which a piezoelectric substrate including a plurality of conductive strip electrodes and a semiconductive substrate including a depletion layer control electrodes as well as capacitance read-out electrodes are independently formed from each other, and the conductive strip electrodes are connected to the depletion layer control electrodes, allowing a convolution signal to be taken from the capacitance read-out electrodes.

SUMMARY OF THE INVENTION

In accordance with the present invention, there is provided a surface acoustic wave convolver which comprises:

a piezoelectric substrate;

a plurality of conductive strip electrodes, an input signal transducer and a reference signal transducer all provided on said piezoelectric substrate;

a semiconductive substrate;

depletion layer control electrodes and capacitance read-out electrodes both provided on said semiconductive substrate; and said conductive strip electrodes being connected to said depletion layer control electrodes to allow output of a convolution signal from said capacitance read-out electrodes.

DETAILED DESCRIPTION OF THE PREFERRED EMBODIMENT

Figure 1:
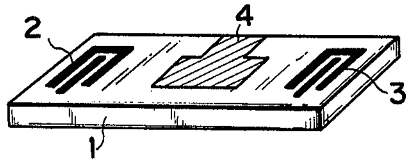
FIG. 1 PRIOR ART
FIGS. 1 and 2 are perspective diagrammatic views showing conventional devices, respectively.

The present invention will now be described in detail by way of an embodiment referring to the drawings.

Figure 2:
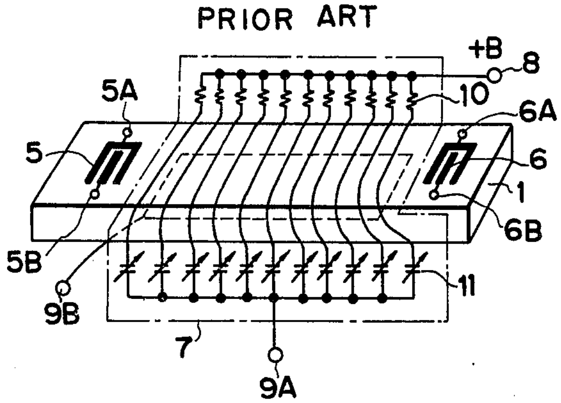
FIG. 2 PRIOR ART
Figure 3:
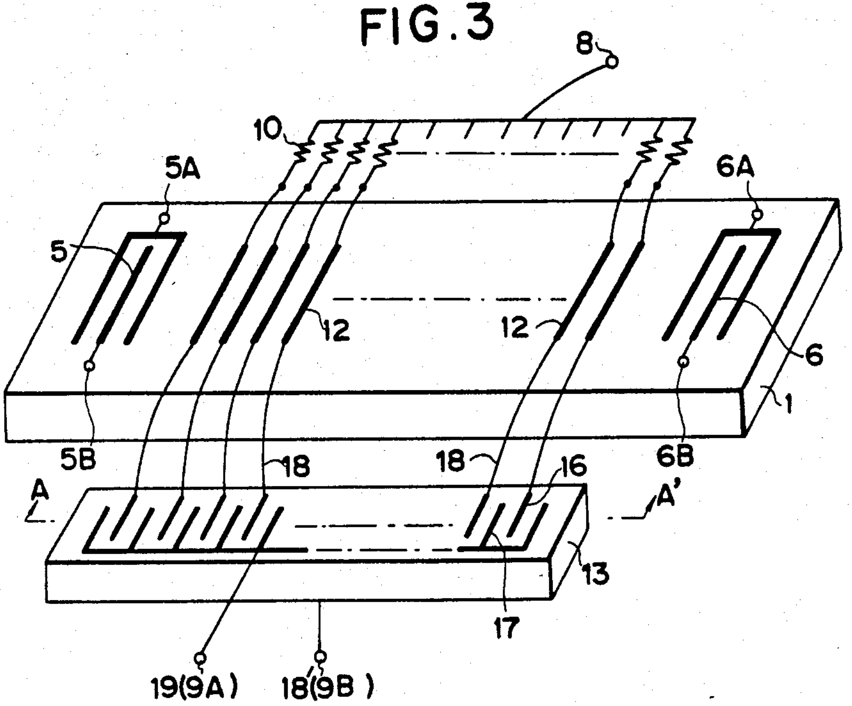
FIGS. 3 and 4 are respectively a diagrammatic perspective view and a diagrammatic sectional view of an embodiment of a surface acoustic wave convolver according to the present invention.

FIG. 3 is a schematic view of an embodiment of the surface acoustic wave convolver according to the present invention in which members or parts which are the same as those in FIG. 2 are designated by the same reference numerals. A plurality of conductive strip electrodes 12 are disposed adjacent to the input signal transducer 5 and the reference signal transducer 6. The conductive strip electrodes 12 may be formed by first depositing aluminum over the surface of a lithium niobate substrate by vapor deposition, etc. and thereafter removing unnecessary parts of the aluminum layer by photo-etching, etc.

Semiconductive substrate 13 is N type silicon, for example. Along one surface of the semiconductive substrate 13 are selectively formed P type regions 15, by first depositing an insulative layer 14 of silicon dioxide, for example, over the surface of the semiconductive substrate 13, thereafter forming windows by photo-etching, and finally diffusing P type impurity through the windows. Electrodes 16 (for depletion layer control) are formed on the P type regions and electrodes 17 (for capacitance reading) in a number corresponding to the number of depletion layer control electrodes 16 are formed on the remaining parts of the insulative layer 14. A common electrode of terminal 18' is formed on the opposite surface of the N type substrate 13. Individual conductive strip electrodes 12 are connected to respective depletion layer control electrodes 16 by bonding wires 18 and the capacitance read-out electrodes 17 are connected to each other by a common terminal 19. Connection between the electrodes 12 and 16 may be done by metal vapor deposition, photo etching etc.

In this case, the bias resistors 10 can be connected to the electrodes 12 or to the electrodes 16, so that if desired they may be formed by depositing a resistance material like Ni-Cr alloy, for example, on the semiconductive substrate 13 by vapor deposition, etc. Therefore, it is not necessary to provide the resistors 10 independently.

Figure 4:
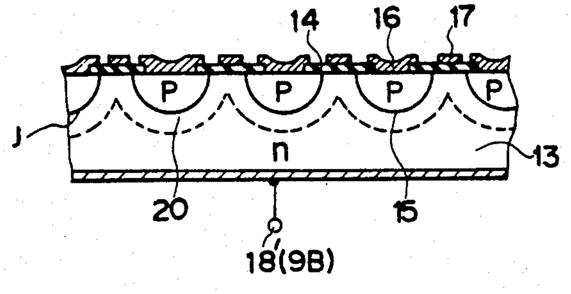

With this arrangement, variable-capacitance diodes comprising three terminals, namely the depletion layer control electrodes 16, capacitor read-out electrodes 17 and common electrode 18' are formed on the semiconductive substrate 13. When a reverse bias voltage is applied to the bias electrode terminal 8, depletion layers 20 (FIG. 4) expand from PN junctions J and variable capacitance is obtained at the terminals 17. Since the depletion layers expand and contract in both width and depth directions, relatively desirable capacitance-variation characteristics can be obtained by varying locations of the electrodes 16 and 17.

The capacitance read-out electrode 17 in this embodiment is configured in a so-called MIS structure wherein the electrode is formed on the semiconductive substrate 13 through the insulative layer 14. However, it may be configured in a PN junction arrangement by forming another region with conductivity opposite to the substrate 13 and providing the electrode on it, or in a Schottky barrier arrangement by forming a metallic layer and providing the electrode on it or using the metallic layer itself as the electrode.

When an input signal is applied to the input signal terminals 5A and 5B, the signal is converted to a surface acoustic wave by the input signal transducer 5 and travels rightward in the Figure. On the other hand, a reference signal applied to the terminals 6A and 6B is converted to a surface acoustic wave by the reference signal transducer 6 and travels leftward. At that time, the piezoelectric substrate 1 causes an electric potential in accordance with travel of the surface acoustic waves due to piezoelectricity of the substrate 1. The electric potential is applied to the depletion layer control electrodes 16 through the conductive strip electrodes 12.

Figure 5:
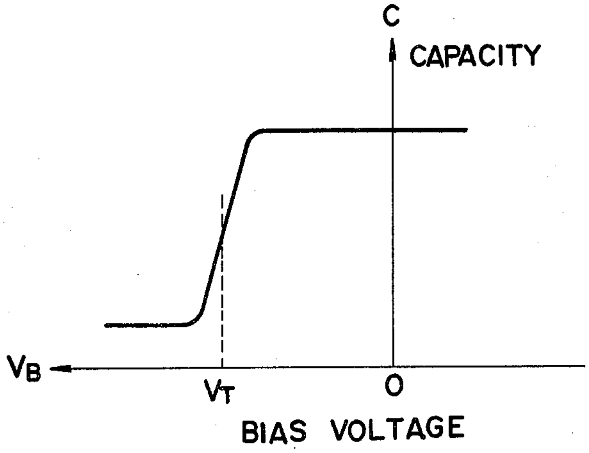
FIG. 5 is a graph showing a characteristic of capacitance variation of the present invention.

The relation between the bias voltage $V_B$ applied to the depletion layer control electrode 16 through the bias voltage terminal 8 and the capacitance C which is read out between the capacitance read-out electrode 17 and the common electrode 18' is as shown in FIG. 5 in which bias voltage $V_B$ varies rapidly near the threshold voltage $V_T$. Therefore, by selecting bias voltage $V_B$ to be applied to the terminal 8 near $V_T$, nonlinearity of capacitance with respect to variations in the magnitude of electric potential caused by acoustic surface waves applied to the depletion layer control electrode can be made maximum, thereby increasing convolution efficiency.

Further, assume that an input signal carrier with frequency $f_1$ is applied to the input signal transducer 5 and a reference signal carrier with frequency $f_2$ is applied to the reference signal transducer 6, so that the depletion layer control electrodes 16 are supplied with a voltage of both the frequencies $f_1$ and $f_2$, and so that a voltage with frequency $f_1+f_2$ is put out of the capacitance read-out electrodes 17 due to the capacitance nonlinearity. This voltage varies for every conductive strip electrode 12. However, the output obtained from the capacitance read-out electrode 18 by electrically connecting the respective conductive strip electrodes 17 becomes the convolution of the signals with frequencies $f_1$ and $f_2$.

As described in the above, the surface acoustic wave convolver according to the present invention generally includes the piezoelectric substrate and the semiconductive substrate, of which both are formed independently from each other. The conductive strip electrodes are formed on the former while the depletion layer control electrodes and the capacitance read-out electrodes are independently formed on the latter. The conductive strip electrodes are connected to the depletion layer control electrodes so that convolution signal is taken from the capacitance read-out electrodes. This leads to improvement of convolution efficiency. Further, use of the variable-capacitance diodes with three terminals permits desired control of the capacitance variation. Possibility of formation of the bias resistors and the variable-capacitance diodes on one common semiconductive substrate permits application of technique of semiconductive integrated circuits (IC) and improvement of manufacturing facility.

As described in the above, the present invention makes it possible to enlarge capacitance nonlinearity and accordingly to improve convolution efficiency.

It should be noted that the piezoelectric member as being the substrate for travel of surface acoustic waves is not restricted to a single-material body but may be laminations of several kinds of material.

The embodiments of the invention in which an exclusive property or privilege is claimed are defined as follows:

1. A surface acoustic wave device adapted for signal convolution, comprising a piezoelectric substrate; a plurality of conductive strip electrodes provided on a surface of said piezoelectric substrate; an input signal transducer provided on said surface of said piezoelectric substrate; a reference signal transducer provided on said surface of said piezoelectric substrate; a semiconductive substrate; depletion layer control means having plural depletion layer control electrodes provided on a surface of said semiconductive substrate for producing a depletion layer in said semiconductive substrate in the region of each said depletion layer control electrode in response to the application of a bias voltage thereto, and capacitance read-out means having plural capacitance read-out electrodes provided on said surface of said semiconductive substrate which are responsive to the capacitance of respective said depletion layers in said semiconductive substrate; means connecting said conductive strip electrodes to respective said depletion layer control electrodes; plural bias resistors which are each connected to a respective said conductive strip electrode; means for applying a bias voltage to each said conductive strip electrode through a respective said bias resistor; a common electrode provided on a further surface of said semiconductive substrate; and a convolution output terminal connected to each of said capacitance read-out electrodes; wherein when first and second input signals are respectively applied to said input and reference signal transducers, said surface acoustic wave device produces an output signal at said convolution output terminal which is a convolution of said first and second input signals.

2. The surface acoustic wave device of claim 1, wherein said bias voltage applied to each said depletion layer control electrode through a respective said bias resistor is selected so that the capacitance of the corresponding depletion layer is in a range in which it varies significantly in response to relatively small variations of the voltage at the depletion layer control electrode.

3. A surface acoustic wave device adapted for signal convolution, comprising: a piezoelectric substrate; an input signal transducer provided at a first location on a surface of said piezoelectric substrate; a reference signal transducer provided on said surface of said piezoelectric substrate at a second location spaced from said first location; a plurality of conductive strip electrodes provided on said surface of said piezoelectric substrate between said input signal transducer and said reference signal transducer at locations spaced along a line extending between said first and second locations; a semiconductive substrate; plural depletion layer control electrode means provided on a surface of said semiconductive substrate at spaced locations; plural capacitance electrode means which are each provided on said surface of said semiconductive substrate in the region of a respective one of said depletion layer control electrode means; a common electrode provided on said semiconductive substrate at a location spaced from said depletion layer control electrode means and said capacitance electrode means; means connecting each said conductive strip electrode to a respective one of said depletion layer control electrode means; plural bias resistors, each said bias resistor being connected to one of a respective said conductive strip electrode and a respective said depletion layer control electrode means; means for applying a selectively variable bias voltage between said common terminal and each said depletion layer control electrode means through a respective said bias resistor, said bias voltage producing a depletion layer in said semiconductive substrate in the region of each said depletion layer control electrode means, each said depletion layer having a thickness which is dependent on the magnitude of said bias voltage and each said depletion layer inducing a capacitance between the associated capacitance electrode means and said common terminal, the magnitude of such capacitance being dependent on the magnitude of said bias voltage and changing rapidly from a maximum value to a minimum value when said bias voltage is increased above a threshold voltage, said bias voltage being selected to be in the range of said threshold voltage; and a convolution output terminal connected to each of said capacitance electrode means; whereby when first and second input signals are respectively applied to said input and reference signal transducers, said surface acoustic wave device produces an output signal at said convolution output terminal which is a convolution of said first and second input signals.

* * * * *